(12) United States Patent
Ma et al.

(10) Patent No.: US 9,982,854 B2
(45) Date of Patent: May 29, 2018

(54) LED LAMP FILAMENT

(71) Applicants: HUIZHOU VERY LIGHT SOURCE TECHNOLOGY CO., LTD., Huizhou, Guangdong (CN); VERY OPTOELECTRONICS (HUIZHOU) CO., LTD., Huizhou, Guangdong (CN)

(72) Inventors: Wenbo Ma, Guangdong (CN); Qiurong Liao, Guangdong (CN)

(73) Assignees: HUIZHOU VERY LIGHT SOURCE TECHNOLOGY CO., LTD, Huizhou (CN); VERY OPTOELECTRONICS (HUIZHOU) CO., LTD., Huizhou (CN)

( * ) Notice: Subject to any disclaimer, the term of this patent is extended or adjusted under 35 U.S.C. 154(b) by 0 days. days.

(21) Appl. No.: 15/314,320

(22) PCT Filed: Jul. 8, 2014

(86) PCT No.: PCT/CN2014/081844
§ 371 (c)(1),
(2) Date: Nov. 28, 2016

(87) PCT Pub. No.: WO2015/180238
PCT Pub. Date: Dec. 3, 2015

(65) Prior Publication Data
US 2017/0184262 A1   Jun. 29, 2017

(30) Foreign Application Priority Data

May 29, 2014   (CN) .................... 2014 2 0283962 U

(51) Int. Cl.
*F21V 21/00*   (2006.01)
*F21S 4/20*   (2016.01)
(Continued)

(52) U.S. Cl.
CPC ................ *F21S 4/20* (2016.01); *F21K 9/235* (2016.08); *F21V 19/001* (2013.01);
(Continued)

(58) Field of Classification Search
CPC ....... F21S 4/20; F21S 4/00; F21S 4/28; F21K 9/235; F21K 9/232; F21K 9/00;
(Continued)

(56) References Cited

U.S. PATENT DOCUMENTS

2012/0275157 A1   11/2012   Hsu

FOREIGN PATENT DOCUMENTS

CN   103322525 A   9/2013
CN   203273326 U   11/2013
(Continued)

OTHER PUBLICATIONS

Machine Translation of N.*
(Continued)

*Primary Examiner* — Jason Moon Han
(74) *Attorney, Agent, or Firm* — Coats & Bennett, PLLC

(57) ABSTRACT

A LED lamp filament, comprising: a long strip-shaped substrate, a plurality of light-emitting units arranged on a first surface of the substrate and distributed along the extending direction of the substrate, and a light-transmittable fluorescent glue layer covering the first surface and the plurality of light-emitting units. A plurality of bulges are provided on at least one side of the substrate, and the bulges are distributed along the extending direction of the substrate; one part of light excited by the fluorescent glue layer and emitted from the light-emitting units emits out in a direction towards a second surface, opposite to the first surface, of the substrate from a space between adjacent bulges.

10 Claims, 2 Drawing Sheets

(51) Int. Cl.
| | |
|---|---|
| *H01L 25/075* | (2006.01) |
| *F21V 19/00* | (2006.01) |
| *H01L 33/52* | (2010.01) |
| *H01L 33/50* | (2010.01) |
| *H01L 33/64* | (2010.01) |
| *F21K 9/235* | (2016.01) |
| *F21Y 115/10* | (2016.01) |
| *F21K 9/232* | (2016.01) |
| *F21Y 103/10* | (2016.01) |

(52) U.S. Cl.
CPC ........ *H01L 25/075* (2013.01); *H01L 25/0753* (2013.01); *H01L 33/505* (2013.01); *H01L 33/52* (2013.01); *H01L 33/642* (2013.01); *F21K 9/232* (2016.08); *F21Y 2103/10* (2016.08); *F21Y 2115/10* (2016.08); *H01L 2924/0002* (2013.01)

(58) Field of Classification Search
CPC ... F21K 9/20; F21K 9/23; F21K 9/237; F21K 9/27; F21K 9/275; F21K 9/60; F21K 9/64; F21V 19/001; F21V 19/002; F21V 19/003; H01L 25/075; H01L 25/0753; H01L 33/505; H01L 33/52; H01L 33/642; H01L 2924/0002; H01L 33/54; F21Y 2103/10; F21Y 2115/10
USPC ....................... 362/346, 249.02, 311.02, 800
See application file for complete search history.

(56) References Cited

FOREIGN PATENT DOCUMENTS

| CN | 103441207 A | 12/2013 |
| CN | 203364017 U | * 12/2013 |
| CN | 203367277 U | * 12/2013 |
| CN | 203434200 U | 2/2014 |
| CN | 203500873 U | 3/2014 |

OTHER PUBLICATIONS

Machine Translation of O.*
International search report, International application No. PCT/CN2014/081844. dated Feb. 27, 2015. IPO: Beijing, China.
Extended European Search Report dated Sep. 26, 2017 from Application No. EP 14893522.4.

* cited by examiner

LED LAMP FILAMENT

FIELD OF THE INVENTION

The present disclosure relates a technical field of LED, and more particularly, relates to a LED lamp filament.

BACKGROUND OF THE INVENTION

LED serves as a new light source and is extensively applied to various lightings due to its advantages of a better energy saving effect and a longer service life. The white LED is praised as the fourth generation lighting source which replaces the fluorescent lamp and the incandescent lamp. The LED modifies luminescence principles of the incandescent lamp which luminescence by tungsten filament and the fluorescent lamp which luminescence by three-basis-color powder, it takes advantages of an electric field to luminescence, and processes advantages of a high lighting efficient, non radiation, a long service life, a low power consumption, and environment protection.

The conventional LED holder generally has a cup or bowl shape with a small volume. The LED lamp filament packaged by the LED holder has a small emitting angle, and cannot achieve a luminescence effect equivalent to that of an incandescent lamp filament having.

SUMMARY

Accordingly, it is necessary to provide a LED lamp filament having a relatively large emitting angle.

A LED lamp filament includes: an elongated substrate; wherein at least one side of the substrate is provided with a plurality of protrusions, and the plurality of protrusions are distributed along an extending direction of the substrate; a plurality of light emitting units located on a first surface of the substrate and distributed along the extending direction of the substrate; and a fluorescent adhesive layer covering the first surface and the plurality of light emitting units; wherein partial light emitted from the light emitting units and excited by the fluorescent adhesive layer emits along a direction from a portion between adjacent protrusions towards a second surface of the substrate, the second surface is opposite to the first surface.

According to one embodiment, the plurality of protrusions are arranged on opposite sides of the substrate, respectively.

According to one embodiment, the protrusions on a same side of the substrate are arranged by equal interval.

According to one embodiment, the plurality of protrusions form a wavy or a zigzag shape on the side of the substrate.

According to one embodiment, an orthogonal projection of the fluorescent adhesive layer on the first surface of the substrate overlaps the first surface of the substrate.

According to one embodiment, an area of the orthogonal projection is greater than an area of the first surface of the substrate.

According to one embodiment, a cross-section of the fluorescent adhesive layer which is perpendicular to the extending direction of the substrate has a semi-circular shape or a semi-elliptical shape or a rectangular shape.

According to one embodiment, a width of the fluorescent adhesive layer is greater or equal to a greatest width of the substrate.

According to one embodiment, the LED lamp filament further includes a pin and an insulating connector connected to the pin and the substrate.

According to one embodiment, a minimum width of the substrate is 60% to 80% of a maximum width of the substrate.

In the LED lamp filament mentioned above, the configuration of the protrusions causes the light source emitted from light emitting units to emit towards a side of the substrate which is opposite to the side covered by the fluorescent adhesive layer, thereby increasing an emitting angle of the LED lamp filament.

DETAILED DESCRIPTION OF THE EMBODIMENTS

Figure 1:
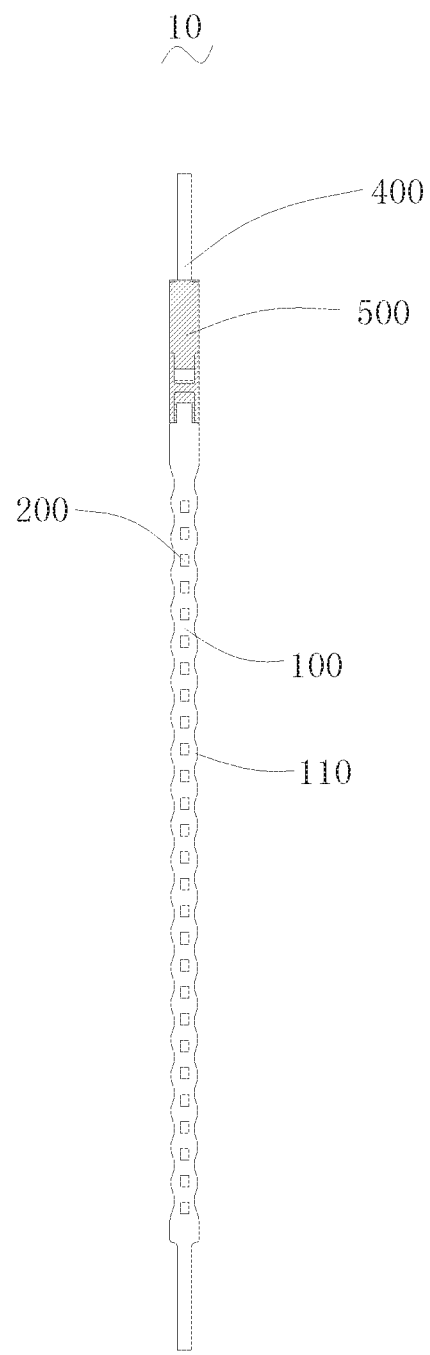
FIG. 1 is a frontal view of a LED lamp filament according to one embodiment.

FIG. 1 is a frontal view of a LED lamp filament 10 according to one embodiment.

The LED lamp filament 10 includes: an elongated substrate 100, a plurality of light emitting units 200 located on a first surface of the substrate 100 and distributed along an extending direction of the substrate 100, and a fluorescent adhesive layer 300 covering the first surface and the plurality of light emitting units 200 (see FIG. 2), a pin 400 and an insulating connector 500 connected to the pin 400 and the substrate 100. At least one side of the substrate 100 is provided with a plurality of protrusions 110, and the protrusions 110 are distributed along the extending direction of the substrate 100. The fluorescent adhesive layer 300 further covers the protrusions 110 and a region between adjacent two protrusions 110.

Opposite sides of the substrate are provided with a plurality of protrusions 110, respectively. The plurality of protrusions 110 are symmetrically arranged, a minimum width of the substrate 100 is 60%~80% of a maximum width. The plurality of protrusions 110 on the same side of the substrate 100 are arranged by equal interval. The plurality of protrusions 110 form a wavy or a zigzag shape on the side of the substrate 100, i.e. the side of the substrate is wavy or zigzag.

Both the substrate 100 and the protrusion 110 are made of copper. It can be understood that the substrate 100 can be made of other conductive heat sink materials, such as aluminum or iron. The protrusions 110 can be located at one side of the substrate 100. Spaces between the protrusions 100 can also be inequal. In addition, the protrusions 110 on opposite sides of the substrate 100 can be staggered, i.e. the protrusion 110 on one side of the substrate 100 is located between two adjacent protrusions 110 on the opposite side of the substrate 100. The protrusion 110 can also have a rectangular shape, when the protrusion 110 has a rectangular shape, the side of the substrate 100 has a tooth shape. It should be noted that a length of the substrate 100 is 30 millimeters, a thickness is 0.4 millimeters, the widest position of the substrate 100 is 1 millimeter, the narrowest position of the substrate 100 is 0.7 millimeters. Each side of the substrate 100 is provided with eight protrusions 110 per 10 millimeters. The substrate 100 can also has other dimensions. Further, a ratio of the widest position to the narrowest position can be other values.

The light emitting units 200 are plural. The plurality of light emitting units 200 are arranged on the substrate 100 by equal interval along the extending direction of the substrate 100. The plurality of light emitting units 200 are arranged in a line, and a distance between the light emitting unit 200 and an edge of the substrate 100 is equal to a distance between the light emitting unit 200 and an opposite edge of the substrate 100. The plurality of light emitting units 200 are electrically connected in series. Partial light emitted from the light emitting units 200 and excited by the fluorescent adhesive layer 300 emits along a direction from a portion between adjacent protrusions 110 towards a second surface of the substrate 100, the second surface is opposite to the first surface. According to an actual requirement, a number of the light emitting units 200 can be 20, and can also be another number. The light emitting unit 200 may adopt a blue light LED chip.

Figure 2:
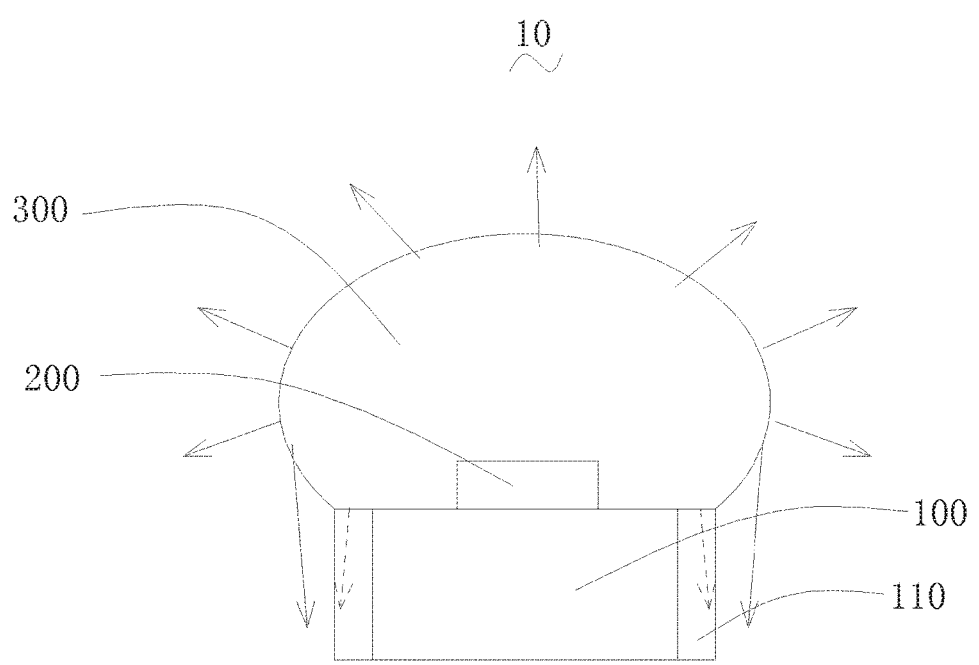
FIG. 2 is a side view of the LED lamp filament of FIG. 1.

Referring also to FIG. 2, FIG. 2 is a side view of the LED lamp filament of FIG. 1.

The fluorescent adhesive layer 300 includes phosphor and adhesive. The phosphor is evenly dispersed in the adhesive. In the illustrated embodiment, the phosphor is YAG yellow power. It can be understood that phosphor of other materials such as silicate, aluminates or nitride can also be adopted. A surface of the fluorescent adhesive layer 300 is an arc surface, i.e. a cross-section of the fluorescent adhesive layer 300 which is perpendicular to the extending direction of the substrate 100 has a semi-circular shape or a semi-elliptical shape. A width of a surface of the fluorescent adhesive layer 300 connecting the substrate 100 is equal to the greatest summed width of the substrate 100 and the protrusion 110. It can also be understood that, a width of the fluorescent adhesive layer 300 is greater or equal to the greatest width of the substrate 100. An orthogonal projection of the fluorescent adhesive layer 300 on the first surface of the substrate 100 overlaps the first surface of the substrate 100, and an area of the orthogonal projection is greater than an area of the first surface of the substrate 100. A width of the fluorescent adhesive layer 300 can be 1.2 millimeters. According to an actual requirement, the width of the fluorescent adhesive layer 300 can be other values, such as 1.3 millimeters. In addition, the cross section of the fluorescent adhesive layer 300 which is perpendicular to the extending direction of the substrate 100 can have other shape such as a rectangle.

In the LED lamp filament 10 mentioned above, the light source emitted from the light emitting units 200 is refracted outside the fluorescent adhesive layer 300 by the fluorescent adhesive layer 300. Due to the configuration of the protrusions 110, the light source can penetrate through the narrowest position of the substrate 100, and emits towards a side of the substrate 100 which is opposite to the side covered by the fluorescent adhesive layer 300. In the light source emitted from the light emitting units 200, the fluorescent adhesive layer 300 absorbs a part of the blue light to emit a yellow light having a greater wavelength, the yellow light and the residual blue light are mixed to synthesis a different color temperature according to a predetermined percentage, and displays a white light.

In the LED lamp filament 10 mentioned above, the configuration of the protrusions 110 causes the light source emitted from light emitting units 200 to emit out towards a side of the substrate 100 which is opposite to the side covered by the fluorescent adhesive layer 300, thereby increasing an emitting angle of the LED lamp filament 10. In addition, the protrusion 110 enables the fluorescent adhesive layer 300 to be adhered to the substrate 100 more stably, and prevents the fluorescent adhesive layer 300 from falling due to a narrow covering surface on the substrate 100. Because the substrate 100 is made of metallic and heat conductive material, and a side of the substrate 100 is covered by the fluorescent adhesive layer 300, causing a heat sink effect of the substrate 100 to be better, thereby solving problems of the LED filament 40 such as being unable to bear large amounts of current and a high cost.

The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. An LED lamp filament, comprising:
    an elongated substrate with a first surface and an opposing second surface and with opposing sides between the first and second surfaces, wherein at least one of the sides of the substrate is provided with a plurality of protrusions, and the plurality of protrusions are distributed along an extending direction of the substrate;
    a plurality of light emitting units located on the first surface of the substrate and distributed along the extending direction of the substrate; and
    a fluorescent adhesive layer covering the first surface and the plurality of light emitting units and being away from the second surface of the substrate;
    wherein partial light emitted from the light emitting units and excited by the fluorescent adhesive layer emits along a direction from a portion between adjacent protrusions towards the second surface of the substrate.

2. The LED lamp filament according to claim 1, wherein the plurality of protrusions are arranged on the opposing sides of the substrate, respectively.

3. The LED lamp filament according to claim 2, wherein the plurality of protrusions on one of the first and second surfaces of the substrate are arranged by equal interval.

4. The LED lamp filament according to claim 2, wherein a minimum width of the substrate is 60% to 80% of a maximum width of the substrate.

5. The LED lamp filament according to claim 1, wherein the plurality of protrusions forms a wavy or a zigzag shape on at least one of the sides of the substrate.

6. The LED lamp filament according to claim 1, wherein an orthogonal projection of the fluorescent adhesive layer on the first surface of the substrate overlaps the first surface of the substrate.

7. The LED lamp filament according to claim 6, wherein an area of the orthogonal projection is greater than an area of the first surface of the substrate.

8. The LED lamp filament according to claim 1, wherein a cross-section of the fluorescent adhesive layer which is perpendicular to the extending direction of the substrate has a semi-circular shape or a semi-elliptical shape or a rectangular shape.

9. The LED lamp filament according to claim 1, wherein a width of the fluorescent adhesive layer is greater or equal to a greatest width of the substrate.

10. The LED lamp filament according to claim 1, further comprising a pin and an insulating connector connected to the substrate.

* * * * *